United States Patent [19]
Stern et al.

[11] Patent Number: 5,818,061
[45] Date of Patent: *Oct. 6, 1998

[54] APPARATUS AND METHOD FOR OBTAINING THREE-DIMENSIONAL DATA FROM OBJECTS IN A CONTIGUOUS ARRAY

[75] Inventors: Howard Stern, Greenlawn; William E. Yonescu, Smithtown; Alex Mauro, Holbrook, all of N.Y.

[73] Assignee: Robotic Vision Systems, Inc., Hauppauge, N.Y.

[*] Notice: The term of this patent shall not extend beyond the expiration date of Pat. No. 5,600,150.

[21] Appl. No.: 533,170

[22] Filed: Sep. 25, 1995

Related U.S. Application Data

[63] Continuation-in-part of Ser. No. 903,524, Jun. 24, 1992, Pat. No. 5,463,227.

[51] Int. Cl.⁶ .................................................. G01N 21/86
[52] U.S. Cl. ................. 250/559.29; 250/559.3; 250/559.31; 250/559.4; 356/376
[58] Field of Search ................. 250/201.3, 216, 250/234, 559.23, 559.29, 559.3, 559.34, 559.36, 559.45, 559.46, 208.1; 356/376; 359/385, 386

[56] References Cited

U.S. PATENT DOCUMENTS

| | | | |
|---|---|---|---|
| 3,355,590 | 11/1967 | Bertram | 250/202 |
| 3,881,605 | 5/1975 | Grossman | 214/1 |
| 4,238,147 | 12/1980 | Stern | 356/376 |
| 4,264,202 | 4/1981 | Gugliotta et al. | 250/559.39 |
| 4,622,462 | 11/1986 | Eaton et al. | 250/238 |
| 4,983,827 | 1/1991 | Ikegaya et al. | 250/559.34 |
| 5,028,799 | 7/1991 | Chen et al. | 250/559.23 |
| 5,164,602 | 11/1992 | Lettang | 250/559.3 |
| 5,205,395 | 4/1993 | Bruno et al. | 198/389 |
| 5,263,567 | 11/1993 | Costa | 198/382 |
| 5,463,227 | 10/1995 | Stern et al. | 356/376 |
| 5,546,189 | 8/1996 | Svetkoff et al. | 250/559.31 |
| 5,600,150 | 2/1997 | Stern et al. | 250/559.3 |

OTHER PUBLICATIONS

*Robotic Vision Systems, Inc. v. View Engineering, Inc.*, __F. Supp. __(CV 95–7441 LGB (AJWx), C.D. California (entered Mar. 5, 1996).

Primary Examiner—Stephone B. Allen
Attorney, Agent, or Firm—Morrison Law Firm

[57] ABSTRACT

A method and apparatus are provided for efficiently using 3-D vision systems to measure selected structural features of objects that have a uniform geometric arrangement. The method and apparatus are particularly well suited for optimizing the 3-D measurement of a multiple lead frame, leads of integrated circuit devices mounted on the multiple lead frame, and ball grid array integrated circuit devices on a wafer. For obtaining the three-dimensional data, corresponding sides of the multiple lead frames or devices are scanned sequentially in a row or column with at least one three dimensional sensor. This scanning procedure is repeated for all rows and columns containing structural features of the devices for which data are to be obtained. The acquired three-dimensional device geometry data are compared with the intended predetermined geometry to produce a signal indicative of a deviation of an actual device geometry from the intended predetermined geometry that exceeds a specified tolerance.

8 Claims, 10 Drawing Sheets

FIG. 10

APPARATUS AND METHOD FOR OBTAINING THREE-DIMENSIONAL DATA FROM OBJECTS IN A CONTIGUOUS ARRAY This is a continuation-in-part of application Ser. No. 07/903,524 filed Jun. 24, 1992, now U.S. Pat. No. 5,463,227.

BACKGROUND OF THE INVENTION

This present invention relates to increasing the utility of 3-D triangulation sensors which inherently take longer to gather data as their field of view is widened (at constant resolution).

The operation and application of 3-D triangulation sensors is well known in the art as exemplified by U.S. Pat. Nos. 4,238,147, 4,590,367 and 5,028,799. These patents teach the relative motion between a sensor that projects a plane of light on an object whose surface data are to be recorded and the object itself. The plane of light is formed by a collimated light beam, preferably a laser beam, spread by a cylindrical lens or by a spot of light deflected by a mirror mounted on a galvanometer, mechanical motion, spinning mirror, or acousto-optic deflector to form an equivalent plane or a group of spots. Surface depth information is obtained by reading a signal for each part of the plane from a position sensing detector such as a TV camera, a linear photodiode array, or a linear or area type photoconductive device which provides a voltage ratio proportional to the x and or y position of an incident light spot. All of these detectors and their use for range readout in 3-D triangulation systems are well known by those skilled in the art.

When a scanned spot is used to create the light plane and each spot is immediately read out from the detector, the time to scan a given area increases in proportion to the number of spots, since a finite time is required to project each spot and to read out the data for each spot. When an integrating device such as a TV camera is used to gather the data from a projected plane (or equivalent group of spots), the width that can be accommodated is defined by the resolution of a pixel (often ⅟₅₁₂th of the length or width of the detector) and the corresponding resolution desired on the object. This follows from the typical camera pickup resolution created by a 512 by 512 pixel array. The readout time for the 3-D data contained in the projected plane corresponds to the time to read a TV frame which is normally ⅟₃₀th of a second. Thus, the number of 3-D points scanned and read out is limited by time available, typically 512 3-D points in ⅟₃₀th of a second.

3-D sensors are often translated via mechanical means which carry the sensor along its intended measurement path, often at a constant velocity. Any time the path is changed from a straight line or to a new straight line path, the mechanism must be accelerated and decelerated, often slowing the net scanning speed far below that which would be achieved if acceleration and deceleration were not required. This is particularly a problem when scanning around the periphery of a particular semiconductor device in a tray, or the leads in a multiple lead frame, since such scanning requires three changes of direction to scan leads on four sides of the device.

Semiconductor devices generally are fabricated in a machine fabrication operation since exact precision of manufactured devices is required to insure that, inter alia, such devices have an exact intended predetermined geometry. Although machine fabrication produces high quality results, sometimes process variables result in devices are fabricated which have an intended geometry, e.g., lead-to-lead spacing and coplanarity, outside acceptable tolerances. These possible deviations require inspection of the devices to ascertain that exact precise fabrication has been accomplished. Where found, defective devices are removed and discarded or refurbished to have the intended geometry.

Manufactured devices are required to be precision components having geometries of precise predetermined nature. Of particular interest is the geometry of leads on the devices, these leads requiring, inter alia, particular spacing between leads as well as lead coplanarity. Deviation or departure of values relating to lead spacing and coplanarity are cause to reject a lead frame as defective until required lead straightening, if possible, can be effected.

OBJECTS AND SUMMARY OF THE INVENTION

An object of the present invention is to reduce significantly the amount of data and time required in scanning an item such as a multiple lead frame or objects in multiple lead frames.

Another object of the present invention is to reduce significantly the amount of data and time required for scanning an item such as a semiconductor wafer with a mini or micro ball grid array (BGA) or pin grid array (PGA).

Using a 3-D sensor, the devices are scanned along corresponding device structural features in row and column course, thus acquiring three-dimensional device geometry data. Where the structural feature of interest is lead geometry, the data pertain to lead spacing, lead coplanarity or whatever other device geometry feature is of interest. As used herein, device geometry includes the presence or absence of the structural feature of interest.

It is understood that "corresponding device structural feature" as used herein means a same element of the structure of a device, or part of a device which is found on each, which is identical with that of another device. For example, the structural feature can be the leads extending laterally on one or more sides of a semiconductor device. It also could simply be a side of a device. Other structural features of interest include a pin-grid array or a ball-grid array of solder deposits.

A first reduction in time is implemented by changing the scan pattern from one that sequentially scans the four sides of an item (device) to a scan pattern that scans across items disposed in a row and column array. The scan covers the corresponding sides of all items in a row or column, without changing direction at the end of scanning leads of each device. This significantly reduces the number of direction changes that are required and thus reduces the number of acceleration-deceleration cycles required while simultaneously reducing their importance since the cycles are spaced much farther apart in both distance and time.

Briefly stated, a method and apparatus are provided for efficiently using 3-D vision systems to measure selected structural features of objects that have a uniform geometric arrangement. The method and apparatus are particularly well suited for optimizing the 3-D measurement of a multiple lead frame, leads of integrated circuit devices mounted on the multiple lead frame, and ball grid array integrated circuit devices on a wafer. For obtaining the three-dimensional data, corresponding sides of the multiple lead frames or devices are scanned sequentially in a row or column with at least one three dimensional sensor. This scanning procedure is repeated for all rows and columns containing structural features of the devices for which data are to be obtained. The acquired three-dimensional device geometry data are compared with the intended predetermined geometry to produce a signal indicative of a deviation of an actual device geometry from the intended predetermined geometry that exceeds a specified tolerance.

According to an embodiment of the invention, a method for inspecting a plurality of objects includes scanning at least first and second objects, each of the at least first and second objects having at least first and second sides, and each of the at least first sides being contiguously aligned with one another, scanning in a straight line path contiguously across corresponding structural features of at least two adjacent ones of the at least first sides to acquire three-dimensional device geometry data from the objects, further scanning the at least second sides with the at least one sensor to acquire additional three-dimensional device geometry data, and comparing the acquired three-dimensional device geometry data with an intended predetermined geometry to produce a signal indicative of a deviation of an actual device geometry from the intended predetermined geometry that exceeds a specified tolerance.

According to an embodiment of the invention, a method for inspecting a multiple lead frame includes scanning at least first and second objects, each of the at least first and second objects having at least first and second sides, and each of the at least first sides being contiguously aligned with one another, scanning in a straight line path contiguously across corresponding structural features of at least two adjacent ones of the at least first sides to acquire three-dimensional device geometry data from the objects, further scanning the at least second sides with the at least one sensor to acquire additional three-dimensional device geometry data, and comparing the acquired three-dimensional device geometry data with an intended predetermined geometry to produce a signal indicative of a deviation of an actual device geometry from the intended predetermined geometry that exceeds a specified tolerance.

According to an embodiment of the invention, a method for inspecting a wafer having at least first and second devices included therein includes scanning the at least first and second devices, each of the at least first and second devices having at least first and second sides, and each of the at least first sides being contiguously aligned with one another, scanning in a straight line path contiguously across corresponding structural features of at least two adjacent ones of the at least first sides to acquire three-dimensional device geometry data from the devices, further scanning the at least second sides with the at least one sensor to acquire additional three-dimensional device geometry data, and comparing the acquired three-dimensional device geometry data with an intended predetermined geometry to produce a signal indicative of a deviation of an actual device geometry from the intended predetermined geometry that exceeds a specified tolerance.

According to an embodiment of the invention, an apparatus for inspecting a plurality of objects includes at least one sensor for scanning at least first and second objects, each of the at least first and second objects having at least first and second sides, each of the at least first sides being contiguously aligned with one another, means for scanning in a straight line path contiguously across corresponding structural features of at least two adjacent ones of the at least first sides to acquire three-dimensional device geometry data from the objects, means for further scanning the at least second sides with the at least one sensor to acquire additional three-dimensional device geometry data, and means for comparing the acquired three-dimensional device geometry data with an intended predetermined geometry to produce a signal indicative of a deviation of an actual device geometry from the intended predetermined geometry that exceeds a specified tolerance.

According to an embodiment of the invention, an apparatus for inspecting a multiple lead frame includes at least first and second lead frames on the multiple lead frame, at least one sensor for scanning the at least first and second lead frames, each of the at least first and second lead frames having at least first and second sides, each of the at least first sides being contiguously aligned with one another, means for scanning in a straight line path contiguously across corresponding structural features of at least two adjacent ones of the at least first sides to acquire three-dimensional device geometry data from the at least first and second lead frames, means for further scanning the at least second sides with the at least one sensor to acquire additional three-dimensional device geometry data, and means for comparing the acquired three-dimensional device geometry data with an intended predetermined geometry to produce a signal indicative of a deviation of an actual device geometry from the intended predetermined geometry that exceeds a specified tolerance.

According to an embodiment of the invention, an apparatus for inspecting a wafer includes at least first and second devices on the wafer, at least one sensor for scanning the at least first and second devices, each of the at least first and second devices having at least first and second sides, each of the at least first sides being contiguously aligned with one another, means for scanning in a straight line path contiguously across corresponding structural features of at least two adjacent ones of the at least first sides to acquire three-dimensional device geometry data from the at least first and second devices, means for further scanning the at least second sides with the at least one sensor to acquire additional three-dimensional device geometry data, and means for comparing the acquired three-dimensional device geometry data with an intended predetermined geometry to produce a signal indicative of a deviation of an actual device geometry from the intended predetermined geometry that exceeds a specified tolerance.

The above, and other objects, features and advantages of the present invention will become apparent from the following description read in conjunction with the accompanying drawings, in which like reference numerals designate the same elements.

DESCRIPTION OF THE PREFERRED EMBODIMENTS

Figure 1:
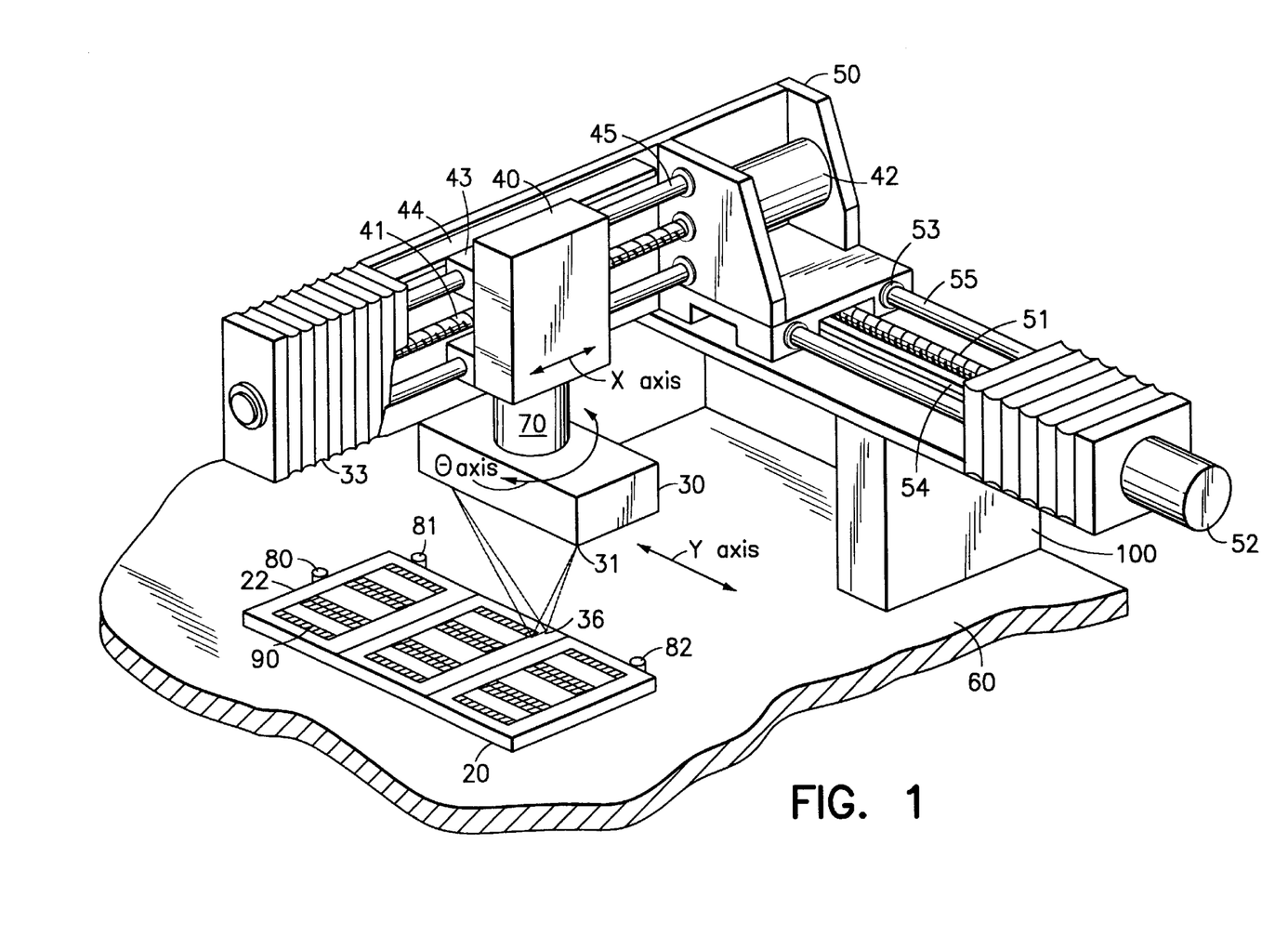
FIG. 1 is a schematic view of a scanning apparatus according to a preferred embodiment of the invention showing a 3-D sensor system mounted to an X-Y motion system along with a multiple lead frame to be scanned.

Referring to FIG. 1, a 3-D sensor 30 is attached to an x, y, theta (θ) positioning table 100, which in turn is mounted to a plate 60 which forms the base for an object such as a multiple lead frame 20. Proper orientation of object 20 on plate 60 is achieved by any conventional means for aligning, such as three banking pins 80, 81, 82. A motor 52 drives a y-axis carriage 50 along a Y axis via a lead screw 51. A linear shaft 55 and a plurality of bearings 53 support y-axis carriage 50. A y-axis linear encoder 54 extracts exact positional information as the positioning table 100 is driven along the Y axis. Y-axis carriage 50 forms the base for an x-axis drive motor 42, an x-axis lead screw 41, and a plurality of x-axis linear shafts 45. An x-axis head 40 is supported by a plurality of linear bearings 43. The position of X-axis head 40 is indicated continuously by a linear encoder 44. X-axis head 40 supports a rotary theta axis 70 which in turn supports 3-D sensor 30.

Figure 2:
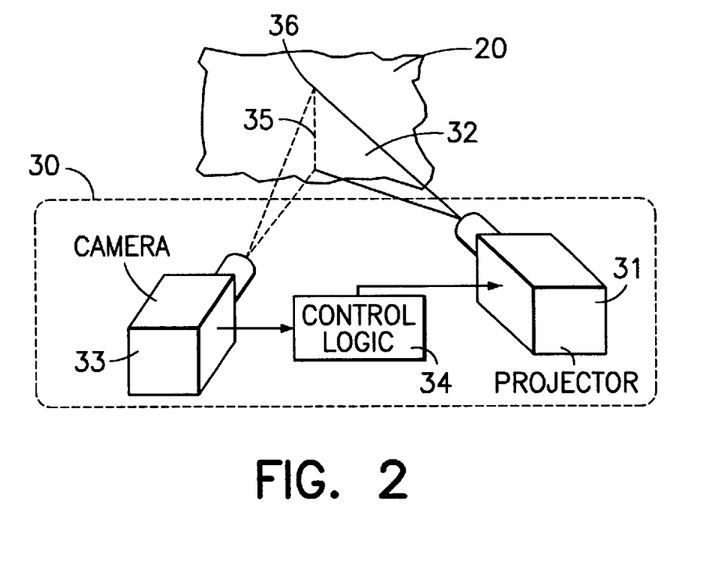
FIG. 2 is a perspective schematic diagram showing the use of a camera and plane of light projector illustrating a basic 3-D sensor construction.

A light plane projector 31, internal to sensor 30, projects a light plane which illuminates a surface of multiple lead frame 20 at a line 36. Alternatively, a flying spot projector (not shown) projects a series of spots 35, as shown in FIG. 2, which illuminate the surface of multiple lead frame 20. Multiple lead frame 20 includes a plurality of individual lead frames 22. Lead frames 22 each include a plurality of leads 90 to be scanned.

Referring to FIG. 2, sensor 30 includes a projector 31 for producing a light plane 32. A camera 33 detects the light reflected from multiple lead frame 20. A timing and light control 34 contains control logic for controlling projector 31 and camera 33. A plurality of light spots 35 substitute for line 36 when using the alternative flying spot projector (not shown) are also shown. The mechanical scan motion must be approximately within 60 degrees of a right angle to the line 36 formed by the intersection of light plane 32 with multiple lead frame 20 in order to scan a swath of at least 50% of the light plane width. Rotary theta axis 70 is used to meet this requirement. Rotary theta axis 70 is turned according to the direction of mechanical scan necessary to keep line 36 at approximately right angles to the direction of motion. If the motion is restricted to pure scans in the x direction and y direction only, then the rotary axis may be eliminated and the sensor head replaced with one containing two 3-D sensors at right angles to each other. One sensor is then oriented so that its light plane is positioned properly for x-scan motion and the other sensor is positioned with its light plane oriented properly for y-scan motion. Sensor output is chosen according to the direction of scan. Alternatively, one sensor with its light plane aligned to be at least within 60 degrees of right angle placement for both orthogonal scan directions may be used.

Figure 3:
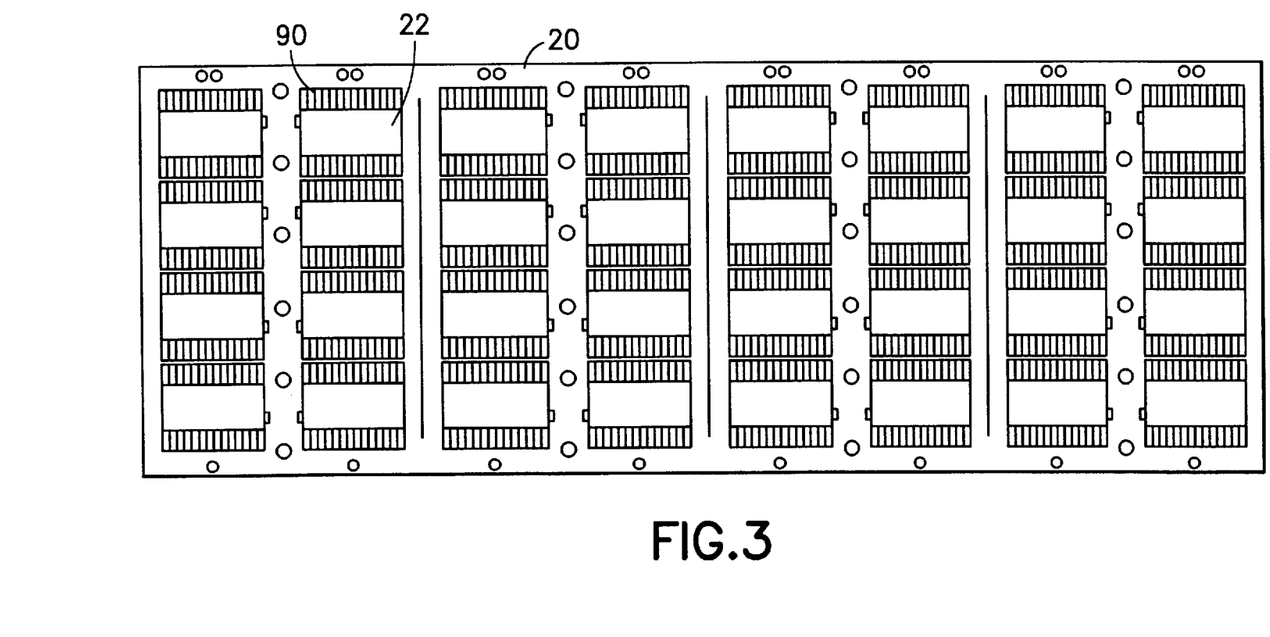
FIG. 3 is a top view of a multiple lead frame.

Referring to FIG. 3, multiple lead frame 20 includes individual lead frames 22 arranged in a symmetrical pattern, such as, for example, four rows of eight individual lead frames 22. Multiple lead frame 20 is designed to be cut into individual lead frames 22 after inspection by scanning. Leads 90 are shown on two sides of each lead frame 22. Leads 90 could also be arranged on one, three, or four sides of each lead frame 22.

Figure 4:
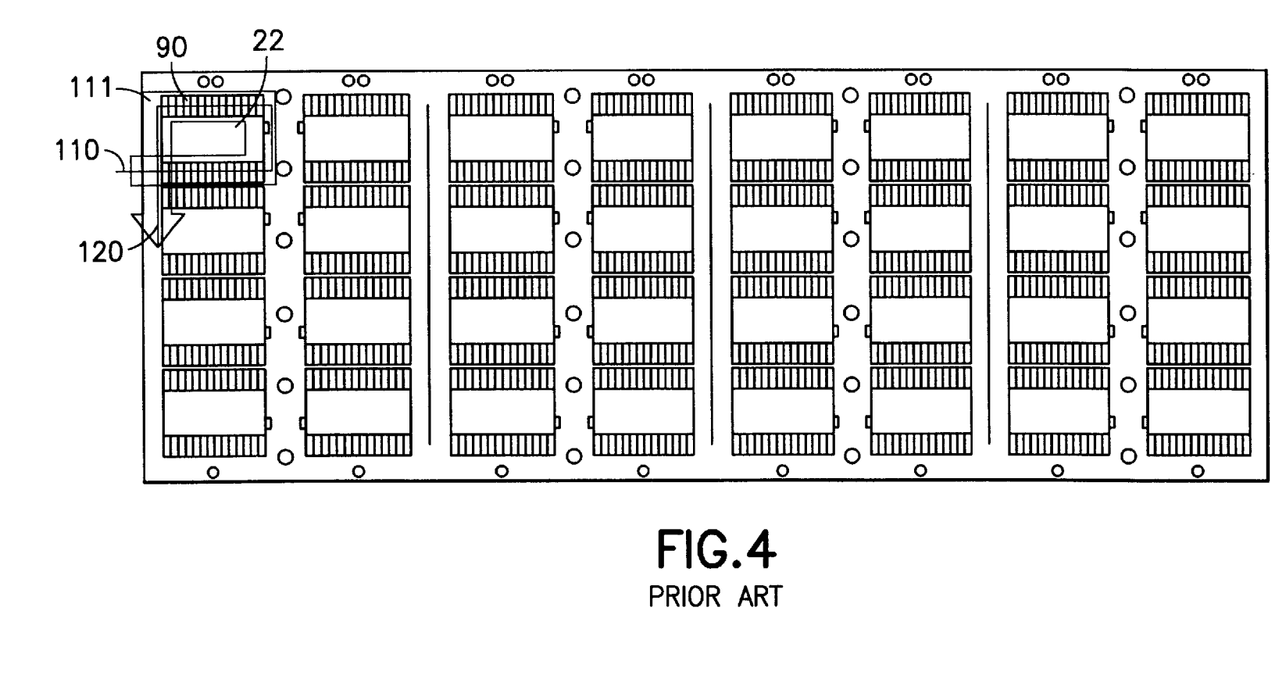
FIG. 4 is a top view of a multiple lead frame being scanned according to a prior art scanning method.

Referring to FIG. 4, a scan path 110 around lead frame 22 produces a scanned area 111 encompassing leads 90, satisfying the requirement for obtaining detailed high resolution 3-D data. This method of scanning, which is commonly employed, is severely encumbered by the need for frequent acceleration and deceleration at each direction change or reversal and additionally may require that the sensor be rotated (when an arrangement with one 3-D sensor in the head and a rotary axis is used) before scanning each of the four straight line segments making up the rectangular donut-shaped scanned area 111. Similarly, scanning each of the segments requires that one axis, either the x-axis or the y-axis, be accelerated up to scan velocity and then decelerated to a stop. During each scan corresponding to one segment, the 3-D data for leads 90 on one side of an object are captured. The number of acceleration-deceleration pairs required is equal to a minimum of four times the number of objects since each object has four sides. Each acceleration-deceleration pair adds a significant amount of extra time to the scan time, thereby degrading the performance from the ideal predicted from scan time requirements alone. Accelerations and decelerations required to travel from object to object along an unscanned path 120 are not taken into account in this computation. Accelerations and decelerations along unscanned path 120 further degrades performance.

Figure 5:
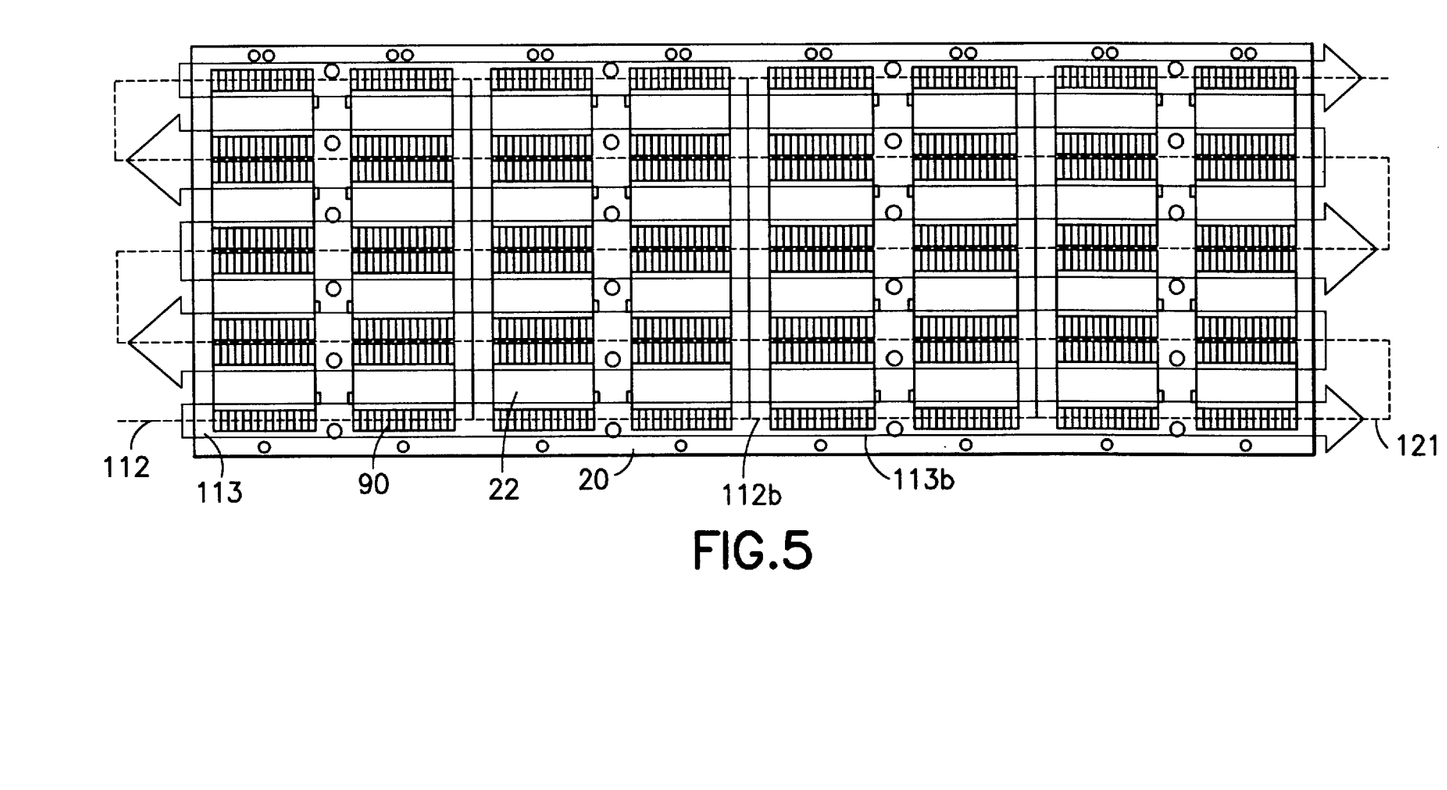
FIG. 5 is a top view of a multiple lead frame being scanned according to an embodiment of the invention.
Figure 6:
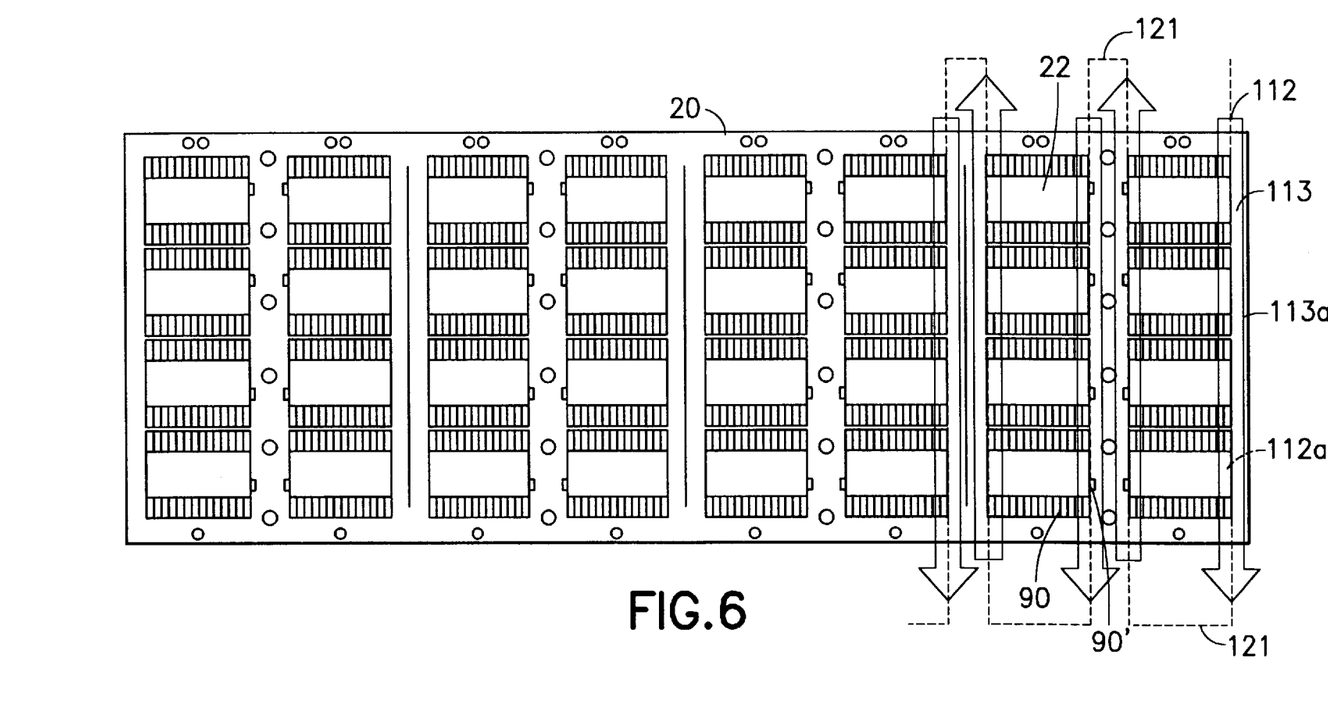
FIG. 6 is a top view of a multiple lead frame being scanned according to an embodiment of the invention.

Referring to FIGS. 5 and 6, scanning along a scan path 112 produces a scanned area 113. Scan path 112 extends contiguously across adjacent leads 90 and 90' of several lead frames 22 of multiple lead frame 20. A scan path 112a and its corresponding scanned area 113a are along a short dimension of multiple lead frame 20, while a scan path 112b and its corresponding scanned area 113b are along a long dimension of multiple lead frame 20. Thus, except for the topmost and bottommost rows of leads 90, one scanning pass along the long dimension of multiple lead frame 20 encompasses two adjacent rows of leads 90. Leads 90 are along the long dimension of multiple lead frame 20, while leads 90', if included in each lead frame 22, are along the short dimension of multiple lead frame 20.

Alternatively, if scan path 112b is only wide enough to scan one row of leads 90, two passes along the long dimension of multiple lead frame 20 are required for each row of lead frames 22. Using scan path 112 instead of scan path 110 (shown in FIG. 4) reduces the number of straight-line segments (and therefore acceleration-deceleration pairs) drastically, since the acceleration-deceleration pairs under this alternative now number two times the sum of the number of rows plus columns instead of four times the number of objects as is the case in the prior art.

These scanning methods do not take into account the acceleration-deceleration pairs on a short path 121 required to travel from one scan to the next, but the number of such short paths 121 are far fewer than the number of unscanned paths 120 between lead frames 22 as in the previous method shown in FIG. 4. For instance, a multiple lead frame with four rows of eight lead frames in each row (e.g., 16 columns) holds 32 lead frames and therefore requires at least 128 acceleration-deceleration pairs in scanning according to the FIG. 4 pattern. However, only 21 acceleration-deceleration pairs are required in the method shown in FIGS. 5 and 6.

Figure 7:
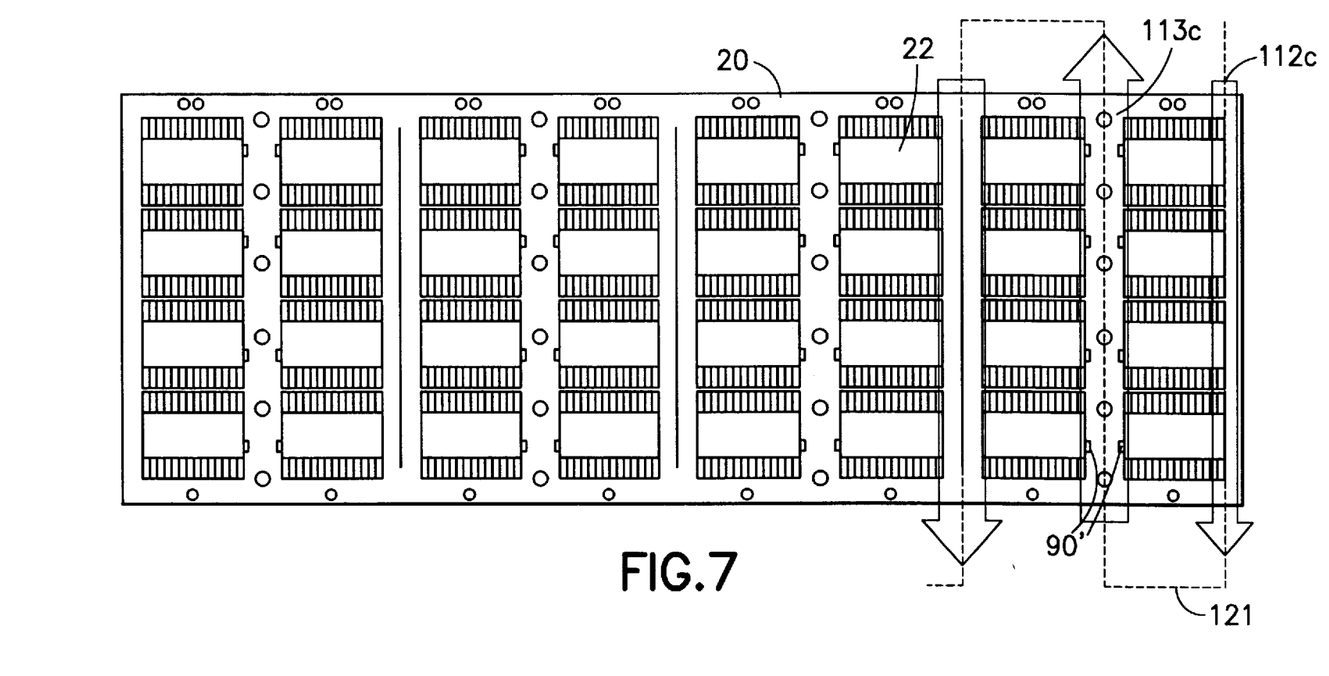
FIG. 7 is a top view of a multiple lead frame being scanned according to an alternative embodiment of the invention.

Referring to FIG. 7, a scanned area 113c along a scan path 112c is wide enough to scan leads 90' on two horizontally adjacent lead frames 22. Using scanned area 113c in conjunction with scanned area 113b in the method shown in FIG. 5 further reduces the required acceleration-deceleration pairs to 14 from the 21 required with the method of FIGS. 5 and 6.

Further scanning of all other rows and columns of the corresponding device structural features is carried out to acquire further three-dimensional device geometry data.

Figure 10:
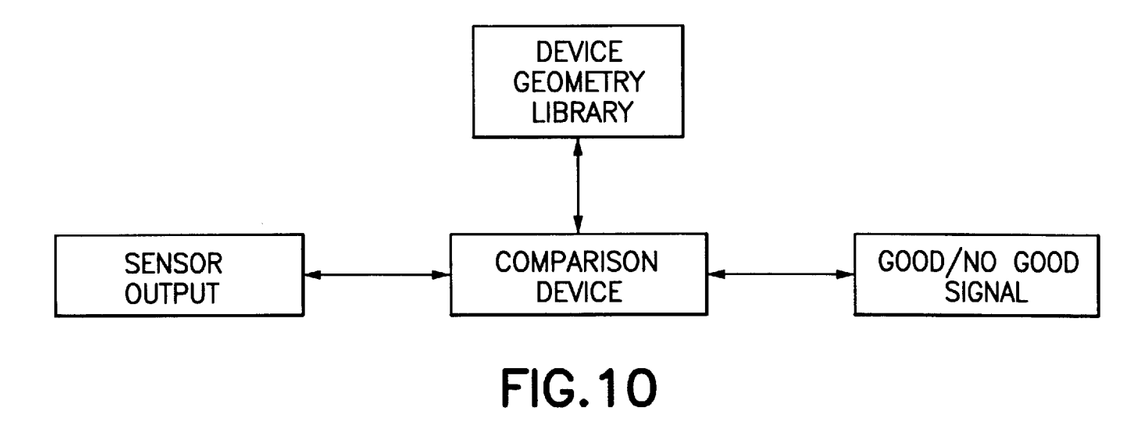
FIG. 10 is a schematic view of a comparison device for comparing sensor output with a specified device geometry.

Referring to FIG. 10, all such acquired geometry data are input to a comparison device, such as a microprocessor, wherein the actual device geometry from the sensor output is compared with a predetermined desired geometry from a device geometry library. Deviation of the actual geometry from the predetermined geometry is compared to a desired tolerance. A signal is produced indicative of any deviations that exceed the desired tolerance.

Figures 8A, 8B:
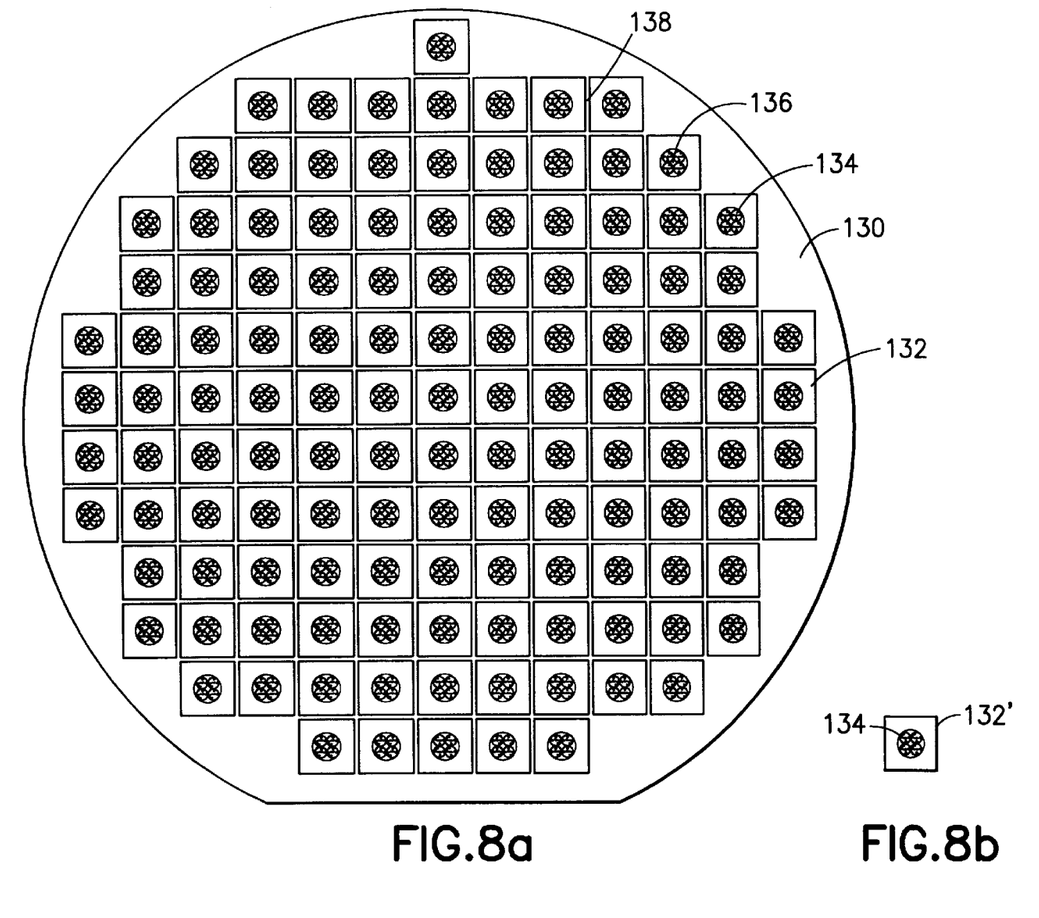
FIG. 8a is a top view of a micro-ball grid array on a plurality of devices on a wafer.
FIG. 8b is a top view of a micro-ball grid array on an individual cut device.

Referring to FIGS. 8a–8b, a plurality of micro-ball grid array (mBGA) devices 132 are shown on a wafer 130. In a ball grid array (BGA) device, micro-ball grid array device, or mini-ball grid array device, the structural features of interest are a plurality of solder balls 134 arrayed in a two-dimensional pattern generally within the perimeter of the devices, rather than at their edges. Solder balls 134 tend to be spherical. The required geometry of the solder balls includes the spacing between the balls (the pitch), the diameter of each ball, the position of each ball, and the height of each ball. The total solder volume in each ball is also determined for process control.

In other words, coplanarity, position, and pitch have to meet certain prescribed tolerances. All the balls 134 in the same group, such as, for example, on one device 132, must have the same tolerance. One method of determining coplanarity is by forming a horizontal reference plane contacting the tops of the three highest balls in the group. The vertical distance from every other ball in the group to this horizontal plane is then measured. If the worst case distance is within the required tolerance, the group meets the coplanarity requirement. As an alternative measurement, the reference plane may be the plane that provides the best fit to all of the tops of the balls on a least mean square error basis.

Each device 132 includes solder balls 134 arranged in a prescribed pattern. A gap 136 is sometimes left in the middle of the arrangement of solder balls 134 on a particular device to meet special mounting or heat sink requirements. Devices 132 are separated from each other by a space 138. The dimensions of gap 136 and space 138 are major factors in determining whether a narrow scan or a wide scan is suitable during the scanning process.

Figures 9A, 9B:
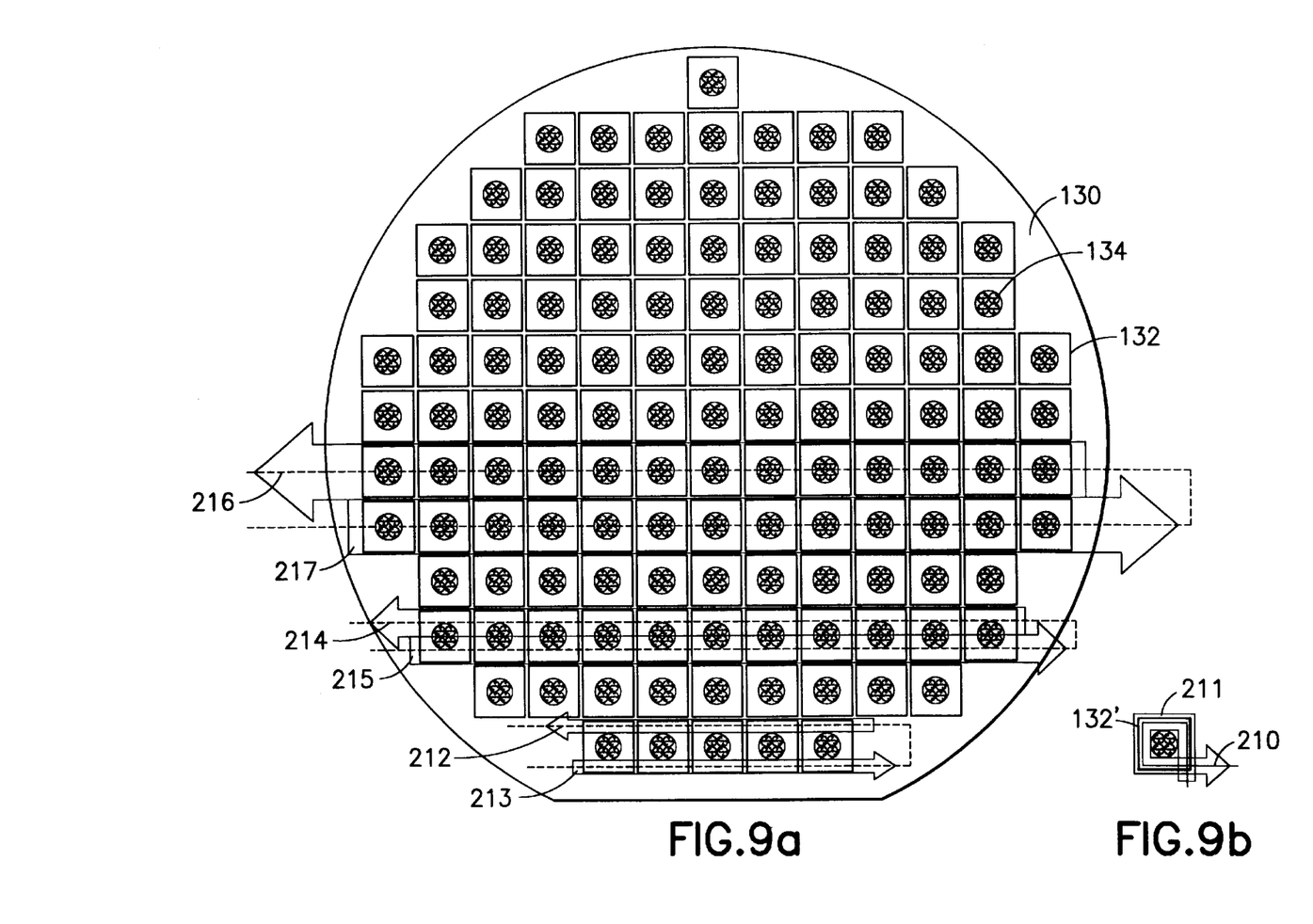
FIG. 9a is a top view of a micro-ball grid array being scanned according to an embodiment of the invention.
FIG. 9b is a top view of a micro-ball grid array on an individual cut device being scanned according to the prior art.

Referring to FIG. 9b, individual cut devices 132' are cut or otherwise separated from wafer 130 according to conventional inspection and testing methods. Individual cut devices 132' are then inspected in a similar fashion to the method described with respect to FIG. 4, above. A scan path 210 and its corresponding scanned area 211 cover all four sides of individual cut device 132'. Three changes of direction are needed during cornering. In addition, during cornering, sophisticated processing is required to ensure that every area is scanned and considered with the least overlap or duplication.

Referring to FIG. 9a, according to the present invention, devices 132 are inspected while uncut and still on their manufacturing wafer 130. The basic principle of the present invention, linearly scanning along an unbroken path which includes elements to be inspected in more than one device, is satisfied. The exact scanning pattern used depends on the pattern of solder balls 134 on devices 132. A scan path 212 and its corresponding scanned area 213 take advantage of the fact that the pattern of solder balls 134 includes gap 136 within each device 132. A relatively narrow scan path allows the sensor to move faster than does a relatively wide scan path. Scan path 212 travels back and forth in the x-axis while being indexed in the y-axis. After all x-axis scans are completed, scan path 212 travels up and down (not shown) in the y-axis while being indexed in the x-axis.

A scan path 214 and its corresponding scanned area 215, wherein scanned area 215 includes half of device 132, is used when solder balls 134 are spread over most of device 132 and no gap 136 exists. Since scanned area 215 is wider than scanned area 213, the sensor (not shown) travels slower when following scan path 214.

If a relatively wide scan is used as depicted by a scan path 216 and its corresponding scanned area 217, an entire row of device 132 is scanned during an x-axis scan. As previously discussed, there is a tradeoff between the width of the scanned area and the speed of the sensor.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A method for inspecting a plurality of objects, comprising:

scanning at least first and second objects with at least one sensor, each of said at least first and second objects having at least first and second sides, and each of said at least first sides being contiguously aligned with one another;

scanning in a straight line path contiguously across corresponding structural features of at least two adjacent ones of said at least first sides to acquire three-dimensional device geometry data from said objects;

further scanning said at least second sides with said at least one sensor to acquire additional three-dimensional device geometry data; and comparing the acquired three-dimensional device geometry data with an intended predetermined geometry to produce a signal indicative of a deviation of an actual device geometry from said intended predetermined geometry that exceeds a specified tolerance.

2. A method according to claim 1, wherein said structural features are located within a perimeter of said at least first and second objects.

3. The method for inspecting a plurality of objects of claim 1, wherein said plurality of objects includes lead frames.

4. The method for inspecting a plurality of objects of claim 1, wherein said plurality of objects includes devices having an array of solder balls.

5. An apparatus for inspecting a plurality of objects, comprising:

at least one sensor for scanning at least first and second objects;

each of said at least first and second objects having at least first and second sides;

each of said at least first sides being contiguously aligned with one another;

means for scanning in a straight line path contiguously across corresponding structural features of at least two adjacent ones of said at least first sides to acquire three-dimensional device geometry data from said objects;

means for further scanning said at least second sides with said at least one sensor to acquire additional three-dimensional device geometry data; and means for comparing the acquired three-dimensional device geometry data with an intended predetermined geometry to produce a signal indicative of a deviation of an actual device geometry from said intended predetermined geometry that exceeds a specified tolerance.

6. An apparatus according to claim 5, further comprising:

at least a third object having at least first and second sides;

said second side of said third object being contiguously aligned with said second side of said first object; and said means for scanning in a straight line path includes second means for scanning in a straight line path contiguously across corresponding structural features of said second sides of said first and second objects to acquire three-dimensional device geometry from said objects.

7. The apparatus for inspecting a plurality of objects of claim 5, wherein said plurality of objects includes lead frames.

8. The apparatus for inspecting a plurality of objects of claim 5, wherein said plurality of objects includes devices having an array of solder balls.

* * * * *